United States Patent
Saito

(10) Patent No.: US 7,504,882 B2
(45) Date of Patent: Mar. 17, 2009

(54) DIFFERENTIAL AMPLIFIER CIRCUIT AND SEMICONDUCTOR DEVICE

(75) Inventor: Hirofumi Saito, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/510,623

(22) Filed: Aug. 28, 2006

(65) Prior Publication Data

US 2007/0058438 A1 Mar. 15, 2007

(30) Foreign Application Priority Data

Sep. 9, 2005 (JP) ............................. 2005-262459

(51) Int. Cl.
*H03F 3/45* (2006.01)
(52) U.S. Cl. ............................. 330/253; 330/9; 330/255
(58) Field of Classification Search ................. 330/253, 330/9, 51, 255, 261; 327/336, 359
See application file for complete search history.

(56) References Cited

U.S. PATENT DOCUMENTS

| | | | | | |
|---|---|---|---|---|---|
| 6,018,267 | A | * | 1/2000 | Tran et al. .................... | 330/255 |
| 6,566,952 | B1 | * | 5/2003 | Allan ........................... | 330/255 |
| 6,657,495 | B2 | * | 12/2003 | Ivanov et al. ................ | 330/255 |
| 6,778,014 | B2 | * | 8/2004 | Rennig ......................... | 330/253 |
| 7,209,005 | B2 | * | 4/2007 | Martins ........................ | 330/255 |

FOREIGN PATENT DOCUMENTS

| | | |
|---|---|---|
| JP | 9-69736 | 3/1997 |
| JP | 2001-251146 | 9/2001 |
| JP | 2002-530916 | 9/2002 |
| WO | WO 00/30249 | 5/2000 |

* cited by examiner

*Primary Examiner*—Khanh V Nguyen
(74) *Attorney, Agent, or Firm*—McGinn IP Law Group, PLLC

(57) ABSTRACT

A differential amplifier circuit in which an input offset voltage is very small. The differential amplifier circuit includes an input-stage differential amplifier section and a cascode-connected single-ended output section connected to the input-stage differential amplifier section. The input-stage differential amplifier section has a folded-cascode-connection. An inverted signal and non-inverted signal on the input side and output side, respectively, of the input-stage differential amplifier section are switched alternatingly in time-shared fashion by switches that are operated by two chopping clock signals of opposite phase.

19 Claims, 15 Drawing Sheets

FIG. 7　REFERENCE ART

FIG .15

VALUES RELATED TO VOLTAGE FOLLOWER (AT VDD=3V)

| Vin[V] | CURRENT OF OUTPUT STAGE | | | Vout[V] |
|---|---|---|---|---|
| | P-CHANNEL TRANSISTOR CURRENT [uA] | N-CHANNEL TRANSISTOR CURRENT [uA] | P/N CURRENT RATIO | |
| 1.0 | 10.10 | 10.00 | 1.01 | 1.01 |
| 1.5 | 10.05 | 10.05 | 1 | 1.5 |
| 2.0 | 10.00 | 10.10 | 0.99 | 1.98 |

US 7,504,882 B2

DIFFERENTIAL AMPLIFIER CIRCUIT AND SEMICONDUCTOR DEVICE

FIELD OF THE INVENTION

This invention relates to a differential amplifier circuit and semiconductor device. More particularly, the invention relates to a circuit configuration most suited for application to a highly accurate integrating circuit.

BACKGROUND OF THE INVENTION

The accuracy of an output voltage produced by an integrating circuit is affected by the input offset voltage of a differential amplifier circuit used in the integrating circuit. In order to realize a highly accurate integrating circuit, it is necessary to minimize the input offset voltage, which arises due to a variance in the threshold voltage (Vt) and transconductance, etc., of the input transistors of the differential amplifier circuit. A problem with the integrating circuit is that an error ascribable to the input offset voltage of a differential stage in the differential amplifier circuit accumulates in the capacitance of the feedback path, resulting in a larger error in the output voltage. That is, irrespective of the fact that the input potential of the integrating circuit is made zero, the output potential deviates from zero owing to the input offset voltage and the capacitance of the integrating circuit is charged or discharged by the shifted error voltage.

Since the input offset voltage is proportional to the reciprocal of the gain of the differential amplifier circuit, the input offset voltage can be reduced by raising the gain. One known technique for raising gain is to adopt a folded-cascode-type differential amplifier circuit in which a gate-grounded transistor is connected to the drain of a source-grounded input transistor, with opposite conductivity types being used for the source-grounded transistor and gate-grounded transistor (e.g., see the specifications of Japanese Patent Kokai Publication Nos. 2001-251146 and 9-69736).

Also known as means for diminishing the occurrence of output-voltage error due to input offset voltage is a chopping technique in which inverted and non-inverted signals in input and output stages of a differential amplifier circuit are changed over alternatingly in time-shared fashion (e.g., see the specification of Japanese Patent Kohyo Publication No. 2002-530916).

[Patent Document 1]
Japanese Patent Kokai Publication No. JP-P2001-251146A

[Patent Document 2]
Japanese Patent Kokai Publication No. JP-A-9-69736

[Patent Document 3]
Japanese Patent Kohyo Publication No. JP-P2002-530916A

SUMMARY OF THE DISCLOSURE

The entire disclosure of the above mentioned documents are incorporated herein by reference thereto.

A specific circuit will be described as an example. FIG. 6 is a circuit diagram of an integrating circuit that utilizes a differential amplifier circuit. The integrating circuit comprises a differential amplifier circuit AMP, a resistor R1 connected between an input terminal INM and an inverting input terminal VinM of the differential amplifier circuit AMP, and a capacitor C1 connected between an output terminal AMPO and the inverting input terminal VinM of the differential amplifier circuit AMP. Further, FIG. 7 is a reference circuit diagram of a differential amplifier circuit AMP, which has been formulated by the present inventor in the trial course toward the present invention. This differential amplifier circuit is composed of a folded-cascode differential amplifier circuit and chopping circuit.

As shown in FIG. 7, the differential amplifier circuit comprises a differential stage ST1, a folded-cascode stage ST2 and an output stage (output section) ST3. The differential stage ST1 and folded-cascode stage ST2 construct an input-stage differential amplifier. The differential amplifier circuit has P-channel transistors T1 to T8 and T13, N-channel transistors T9 to T12 and T14, and switches SW1 to SW8. The switches SW1 to SW8 are constituted by MOS transistors, etc. The switches SW1, SW4, SW5 and SW7 are switched by a clock CK, and the switches SW2, SW3, SW6 and SW8 are switched by an inverted clock CKB, which is obtained by inverting the clock CK. That is, the switches SW1, SW4, SW5, SW7 operate in reverse with respect to the switches SW2, SW3, SW6, SW8.

The sources of the P-channel transistors T1, T5, T6 and T13 are connected to a power supply VDD, and the sources of the N-channel transistors T11, T12 and T14 are connected to ground GND. The gate of P-channel transistor T1 is connected to a terminal Iin4 that applies a fourth bias, and the drain of this transistor is connected to the source of the P-channel transistor T2. The gate of the P-channel transistor T2 is connected to a terminal Iin3 that applies a third bias, and the drain of this transistor is connected to the sources of the P-channel transistors T3 and T4. The P-channel transistor T2 is cascode-connected to the P-channel transistor T1, and the P-channel transistors T1 and T2 function as constant-current sources.

An input terminal VinP is connected to one end of each of the switches SW1 and SW2. The inverting input terminal VinM is connected to one end of each of the switches SW3 and SW4. The other ends of the switches SW1 and SW3 are connected to the gate of the P-channel transistor T4, and the other ends of the switches SW2 and SW4 are connected to the gate of the P-channel transistor T3. The drain of the P-channel transistor T3 is connected to the source of the N-channel transistor T10 and to the drain of the N-channel transistor T12. The drain of the P-channel transistor T4 is connected to the source of the N-channel transistor T9 and to the drain of the N-channel transistor T11. The gates of the N-channel transistors T11, T12 and T14 are connected to a terminal Iin1 that applies a first bias, and the N-channel transistors T11, T12 and T14 function as constant-current sources. The gates of the N-channel transistors T9 and T10 are connected to a terminal In2 that applies a second bias. The P-channel transistors T3 and T4 are connected to the N-channel transistors T10 and T9, respectively, resulting in a differential-type folded-cascode-connection.

The drain of the N-channel transistor T9 is connected to one end of each of the switches SW6 and SW7 and to the drain of the P-channel transistor T7. The drain of the N-channel transistor T10 is connected to one end of each of the switches SW5 and SW8 and to the drain of the P-channel transistor T8. The gates of the P-channel transistors T7 and T8 are connected to the terminal Iin3 that applies the third bias. The source of the P-channel transistor T7 is connected to the drain of the P-channel transistor T5, and the source of the P-channel transistor T8 is connected to the drain of the P-channel transistor T6. The gates of the P-channel transistors T5 and T6 are tied together and connected to the other ends of the switches SW7 and SW8. Here the P-channel transistors T5 and T6 function as constant-current sources, and the P-channel transistors T7 and T8 are cascode-connected to the P-channel transistors T5 and T6, respectively, and construct a current mirror circuit.

The other ends of the switches SW5 and SW6 are connected to the gate of the P-channel transistor T13. The drains of the P-channel transistor T13 and N-channel transistor T14 are tied together and connected to the output terminal AMPO.

The operation of the differential amplifier circuit thus constructed will be described next. Assume that the switches SW1, SW4, SW5 and SW7 are closed (shorted) and that the switches SW2, SW3, SW6 and SW8 are open. A differential signal across the non-inverting input terminal VinP and inverting input terminal VinM is amplified by the P-channel transistors T3 and T4 that construct the differential amplifier, and the amplified signal enters the gate of the P-channel transistor T13 from the drain of the P-channel transistor T8 via the switch SW5 as a non-inverted output signal S10. The P-channel transistor T13 delivers an inverted output signal from the output terminal AMPO, which is the node between the P-channel transistor T13 and the N-channel transistor T14. The latter, which constitutes a load, operates as a constant-current source. It should be noted that the switch SW7 is closed (shorted) so that a prescribed bias is applied to the P-channel transistors T5, T6.

When the clock signal CK is inverted in phase, the switches SW1, SW4, SW5 and SW7 are open and the switches SW2, SW3, SW6 and SW8 are closed (shorted), operation is as described above and the output signal is delivered from the output terminal AMPO. That is, the switches SW1, SW4, SW5, SW7 operate in reverse with respect to the switches SW2, SW3, SW6, SW8 and the non-inverted and inverted signals are interchanged in time-shared fashion at the input side (gates of P-channel transistors T3 and T4) and output side (drains of N-channel transistors T9 and T10) in the folded-cascode differential amplifier circuit, thereby enabling an imbalance to be cancelled out.

Next, the operation of the integrating circuit that utilizes the differential amplifier circuit will be described with reference to FIGS. 6 and 8. In the integrating circuit shown in FIG. 6, an input voltage difference Vin of the integrating circuit is represented by Equation (1) below.

$$Vin = Vnm - Vnp \quad \text{Eq. (1)}$$

where Vnm represents the voltage at the inverting input terminal INM of the integrating circuit and Vnp the voltage at the non-inverting input terminal VinP (input terminal INP) of the differential amplifier circuit AMP.

A current I1 that flows into the resistor R1 is represented by Equation (2) below.

$$I1 = Vin/R1 \quad \text{Eq. (2)}$$

The electric charge in the capacitor C1 is represented by Equation (3) below.

$$I1 * \Delta T = C1 * \Delta V \quad \text{Eq. (3)}$$

where $\Delta T$ represents integration time, which starts at t0, and $\Delta V$ denotes integration voltage.

Transforming Equation (3) and solving for $\Delta T$ gives Equation (4) below.

$$\Delta T = C1 * R1 * \Delta V / Vin \quad \text{Eq. (4)}$$

Operation in a case where Vnp>Vnm holds will be described. The potentials at INP and at node S01 in FIG. 6 become equal in view of the imaginary shorting principle of a differential amplifier circuit, and the current I1 that flows into the resistor R1 connected between S01 and INM flows from S01 to INM. The potential on the S01 side of the integrating capacitor C1 drops. On the other hand, charging takes place on the output side OUT of the capacitor C1. Accordingly, the potential at the output OUT rises by $\Delta V$ (charging takes place) over the time period $\Delta T$, as illustrated in FIG. 8.

On the other hand, if Vnp<Vnm holds, then the current that flows into the resistor R1 reverses and the potential at the output OUT of the integrator falls (discharging takes place) (not shown).

An example of specific numerical values will now be given. If C1=100 pF, R1=100 k$\Omega$, $\Delta V$=1V and Vin=10 μV, for example, then substituting these numerical values into Equation (4) will result in a $\Delta T$ indicated by Equation (5) below.

$$\Delta T = 100 \times 10^{-12} \times 100 \times 10^{3} \times \frac{1}{10} \times 10^{31\ 6} = 1 \ [s] \quad \text{Eq. (5)}$$

In view of Equation (5), it will be understood that when Vin=10μV holds, for example, it is required that $\Delta T$=1 [s] hold in order to elevate voltage by $\Delta V$=1V.

A case that takes an input offset voltage Voff into consideration is indicated in Equation (6) below.

$$\Delta T = C1 * R1 * \Delta V / (Vin - Voff) \quad \text{Eq. (6)}$$

Finding $\Delta T$ in a case where input offset voltage Voff=1 μV holds gives us $\Delta T$=1.11 [s]. Thus, it will be understood that the ratio of the input offset voltage Voff to the input voltage difference Vin influences the output value of the integrating circuit.

Accordingly, as set forth earlier, measures for reducing the input offset voltage Voff have been contemplated. It has been known that the reciprocal of the gain of the differential amplifier circuit is proportional to the input offset voltage, and one example is to make the differential amplifier circuit of the folded-cascode type, which exhibits a high gain. Another method is the chopping technique, which cancels out an imbalance in the threshold value (Vt) of the P-channel transistor T3 and P-channel transistor T4 in the differential stage of the differential amplifier circuit.

If the input of the differential stage of the differential amplifier circuit and the output of folded-cascode section that is the input to the output section are not chopped, a deviation caused by an imbalance in Vt of the P-channel transistor T3 and of P-channel transistor T4 in the differential stage will accumulate, as indicated by the dotted line P1 in FIG. 9. An output voltage characteristic indicated by the solid line P2 in FIG. 9 is obtained by using chopping. With chopping, the switches SW1, SW4, SW5, SW7 and the switches SW2, SW3, SW6, SW8 are switched alternatingly by the regular (non-inverted) and inverted clocks CK and CKB, respectively, shown in FIGS. 6 and 7, thereby canceling the Vt imbalance of the P-channel transistors T3 and T4, which are the transistors of the differential stage. This gives a characteristic equivalent to that of "WITH NO Vt OFFSET" indicated by the dot-and-dash line P3 in FIG. 9, and Vt offset can be cancelled.

In a differential amplifier circuit according to the reference circuit diagram, the gain of the differential amplifier circuit is raised by adopting the folded-cascode configuration and therefore the input offset voltage, which is proportional to the reciprocal of the gain, is reduced. Further, adopting the chopping technique lowers the input offset voltage the cause of which is the Vt offset of the differential stage. Offset due to the output stage of the differential amplifier circuit can be mentioned as a factor that does not allow complete elimination of input offset gain, even if both of the above-mentioned techniques are used conjointly.

The process through which an offset occurs in the output stage ST3 of the differential amplifier circuit will be described next. In a case where a differential amplifier circuit of the kind shown in FIG. 7 is used, the output stage ST3 of this circuit operates as set forth below. The description will be rendered with reference to FIG. 10, in which the N-channel transistor T14 of the output stage ST3 of the differential amplifier circuit in FIG. 7 is extracted and the bias circuit is clearly shown. It should be noted that one example of a method of producing the voltage at terminal Iin1 in FIG. 7 is by using a current source I and an N-channel transistor T0 in FIG. 10. First, the gate and drain of the N-channel transistor T0 are shorted, and stability is attained at a gate-source voltage Vgs and drain-source voltage Vds at a point obtained by adding Vt to the saturated-region side of a boundary (Vds=Vgs−Vt) between a linear region and the saturated region. In other words, the drain current Ids of the N-channel transistor T0 at this point is the same as the current source I, e.g., 10 µA, and Vgs=Vds=1V, by way of example. FIG. 11 illustrates the Vds vs. Ids characteristic of the N-channel transistor T0 of FIG. 10. Next, if the N-channel transistor T0 and the N-channel transistor T14 are constructed to have the same transistor size, then the N-channel transistor T0 and the N-channel transistor T14 will have the same Vgs. With regard to the N-channel transistor T14, Ids is dependent upon Vds. For example, if the voltage at the output terminal AMPO changes from 1.0 to 2.0V, then the drain-source voltage Vds of the N-channel transistor T14 also changes from 1.0 to 2.0V in a manner similar to that of the AMPO-GND voltage. In other words, the drain current Ids of the N-channel transistor T14 varies from 10 to 10.1 µA, as illustrated in FIG. 12, if we assume that the slope of the Vds vs. Ids characteristic when Vgs=1V holds is 0.1 µA/1V. As mentioned above, the drain current Ids on the side of the N-channel transistor in the output stage varies depending upon the value of the drain-source voltage Vds (here the voltage across AMPO and GND). On the other hand, a phenomenon similar to that described with regard to the N-channel transistor T14 occurs also on the side of the P-channel transistor T13, and it will be understood that the current ratio between the P-channel transistor and N-channel transistor of the output stage is dependent upon the output voltage (here AMPO). Accordingly, a problem which arises is that the value (Ids) of the current that flows into the transistor of the output stage varies in dependence upon the output voltage.

How the input offset varies depending upon the offset of the output stage of the differential amplifier circuit will be described. The case of a voltage follower circuit shown in FIG. 13 will be described as an example of a circuit that uses a differential amplifier circuit. Ideally (a case where the offset is zero), the output voltage Vout becomes a voltage the same as that of the input voltage Vin. As shown in FIG. 15, however, the P/N current ratio of the output stage is disturbed by the output voltage value and an offset voltage is produced. When Vin=1.5V holds, this is construed as being ideal (i.e., ideally the offset is zero). When Vin is 1.0V, the current supply capability of the P-channel transistors rises above what is ideal and the output voltage deviates to the VDD side of what is ideal (i.e., ideally it is the same voltage as that of Vin). On the other hand, when Vin is 2.0V, the output voltage deviates to the GND side of what is ideal (i.e., ideally it is the same voltage as that of Vin). In other words, the input offset voltage is changed by the value of the output voltage (here Vout) of the differential amplifier circuit. In the case of a voltage follower circuit mentioned as an example of application using a differential amplifier circuit, the output voltage takes on a potential the same as the Vin voltage, and often the Vin voltage is used upon being fixed to a certain specific value. Since the range of values that can be taken on by the output voltage is narrow, often the offset voltage does not pose that much of a problem. However, in the case of an integrating circuit, which is another example of application of a differential amplifier circuit, there are instances where the output voltage is used while it is constantly changing and the range of values that can be taken on by the output voltage is broad. The effect of this phenomenon is greater. Moreover, in order to operate the device accurately up to smaller values of the input potential difference of the differential amplifier circuit, it is self-evident that the ratio of the input offset voltage Voff to Vin influences the accuracy of the integrating circuit, as will be appreciated also from Equation (6), and it can be construed that the effect of this phenomenon is more conspicuous. The details of the integrating waveform of the integrating circuit (the waveform of OUT vs. time in FIG. 8) are illustrated in FIG. 14. The integrating waveform is a straight line, as indicated by the dashed line, in the ideal case (i.e., when the offset is zero). Assume that it takes time $\Delta T1$ for a change of $\Delta V$. In an integrating circuit that uses the conventional differential amplifier circuit, the waveform becomes non-linear, as indicated by the solid line, and it takes time $\Delta T2$ for a change of $\Delta V$. In other words, $\Delta T2$ becomes longer than $\Delta T1$ of the ideal case. If this solid line is regarded as a straight line, as indicated by the two-dot-and dash line, i.e., if the offset voltage is calculated in terms of the input, this can be expressed in such a manner that the input offset voltage (Voff) is subtracted from the input potential difference (Vin). Thus, as set forth above, it can be construed that the ratio of Voff to Vin is a cause of error in voltage-to-frequency conversion, which is the original purpose of an integrating circuit.

Accordingly, there is much to be desired in the art.

According to a first aspect of the present invention, there is provided a differential amplifier circuit comprising: an input-stage differential amplifier section, and an output section connected to the input-stage differential amplifier section; wherein the output section has a cascode-connected formulation.

In a second aspect, it is preferred that the output section has a single-ended formulation.

In a third aspect, it is preferred that the input-stage differential amplifier section has a folded-cascode-connected formulation.

In a fourth aspect, it is preferred that the output section includes: a first MOS transistor of a first conductivity type having a gate to which a non-inverted output of the input-stage differential amplifier section is connected and a first end to which a first power supply is connected; a second MOS transistor of the first conductivity type having a gate to which a first bias terminal is connected and a first end to which a second end of the first MOS transistor of the first conductivity type is connected; a first MOS transistor of a second conductivity type having a gate to which a second bias terminal is connected and a second end to which the second end of the second MOS transistor of the first conductivity type is connected; and a second MOS transistor of the second conductivity type having a gate to which a third bias terminal is connected, a second end to which a first end of the first MOS transistor of the second conductivity type is connected, and a first end to which a second power supply is connected; the second end of the second MOS transistor of the first conductivity type being connected to an output terminal.

In a fifth aspect, it is preferred that the circuit comprises: a first switch that opens and closes a path between a non-inverting input terminal and a non-inverting input of the input-stage differential amplifier section; a second switch that opens and closes a path between the non-inverting input terminal and an inverting input of the input-stage differential amplifier circuit; a third switch that opens and closes a path between an inverting input terminal and the non-inverting input of the input-stage differential amplifier circuit; a fourth switch that opens and closes path between the inverting input terminal and the inverting input of the input-stage differential amplifier circuit; a fifth switch that opens and closes a path between a non-inverted output of the input-stage differential amplifier circuit and the gate of the first MOS transistor of the first conductivity type; and a sixth switch that opens and closes a path between an inverted output of the input-stage differential amplifier circuit and the gate of the first MOS transistor of the first conductivity type; wherein the first, fourth and fifth switches are operated in reverse with respect to the second, third and sixth switches by a chopping clock signal.

In a sixth aspect, there is provided an integrating circuit comprising: the differential amplifier circuit according to any one of the first to fifth aspects;

the integrating circuit further comprises: a first resistance element connected between a first input terminal and an inverting input terminal of the differential amplifier circuit; a first capacitance element connected between the inverting input terminal and the output terminal of the differential amplifier circuit; a second resistance element connected between a second input terminal and the non-inverting input terminal of the differential amplifier circuit; and a second capacitance element connected between the non-inverting input terminal and ground; wherein the first and second resistance elements have equal resistance values and the first and second capacitance elements have equal capacitance values.

In a seventh aspect, there is provided a semiconductor device having the differential amplifier circuit according to any one of the first to fifth aspects.

A semiconductor device according to an eighth aspect of the present invention has an output stage that receives an input signal, generating an output signal and delivering the output signal to an output terminal. The output stage has first and second transistors connected serially between the output terminal and a first power-supply line, the first transistor is provided in order to suppress a fluctuation in voltage at a connection node of the first and second transistors and has a gate to which a voltage equal to or greater than a threshold value of the first transistor is input, and the second transistor has a gate to which a voltage at which the second transistor operates in the saturated region is input.

In a ninth aspect, in the semiconductor according to the eighth aspect it is preferred that the output stage has third and fourth transistors connected serially between the output terminal and a second power-supply line; and the third transistor is provided in order to suppress a fluctuation in voltage at a connection node of the third and fourth transistors.

In a tenth aspect, it is preferred, in the eighth aspect that the third transistor has a gate to which a voltage equal to or greater than a threshold value of the third transistor is input; and the fourth transistor has a gate to which a voltage at which the fourth transistor operates in the saturated region is input.

In an eleventh aspect, it is preferred, in the eighth to tenth aspects, that the input signal is input to the gate of the second transistor.

In a twelfth aspect, it is preferred, in the eighth to tenth aspects, that the first and second transistors are transistors of a first conductivity type, and the third and fourth transistors are transistors of a second conductivity type that is different from the first conductivity type.

In a thirteenth aspect, it is preferred, in the eighth to twelfth aspects, that the first and third transistors are connected to the output terminal, the second transistor is connected to the first power-supply line, and the fourth transistor is connected to the second power-supply line.

The meritorious effects of the present invention are summarized as follows.

In accordance with the present invention, the output stage is constituted by a cascode connection and therefore the required gain is maintained over a broad range of output voltages. Accordingly, the input offset voltage can be held below a value that is on the microvolt order within a broad range of output voltages and a highly accurate differential amplifier circuit is realized. Further, a semiconductor device most suited for the output stage of a differential amplifier circuit is realized.

Other objects, features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 15 is a diagram illustrating the current voltage value of each component of a voltage follower.

PREFERRED EMBODIMENTS OF THE INVENTION

A preferred embodiment of the present invention will now be described in detail with reference to the drawings.

A differential amplifier circuit according to an embodiment of the present invention comprises an input-stage differential amplifier section, and a single-ended output section connected to the input-stage differential amplifier section and constituted by a cascode connection. A single-ended unit is one that has two inputs, namely positive and negative inputs, and a single output terminal from which the amplified difference between the inputs is output. Further, the input-stage differential amplifier section preferably is constituted by a folded-cascode connection. Furthermore, it may be so arranged that an inverted signal and non-inverted signal on the input side and output side, respectively, of the input-stage differential amplifier section are switched alternatingly in time-shared fashion by a chopping clock signal.

In the output section of the differential amplifier circuit thus constructed, there is a very small change in drain-source voltage in P- and N-channel transistors in which cascode-connected transistors are each connected to the drain side. As a result, there is almost no occurrence of a difference in supply current that accompanies a change in drain-source voltage of P- and N-channel transistors of the output circuit brought about by the value of the output voltage, which is a factor that produces an input offset voltage. That is, transconductance of P- and N-channel transistors is substantially constant and does not depend upon output voltage, and there is no decline in necessary gain over a broad range of output voltages. Accordingly, input offset voltage can be held below a value that is on the microvolt order, by way of example.

Further, if a differential amplifier circuit thus constructed is applied to an integrating circuit, it is possible to realize a highly accurate integrating circuit in which output linearity is maintained with almost no influence from a change in input offset voltage. An embodiment of the invention will now be described in detail.

Embodiment 1

Figure 1:
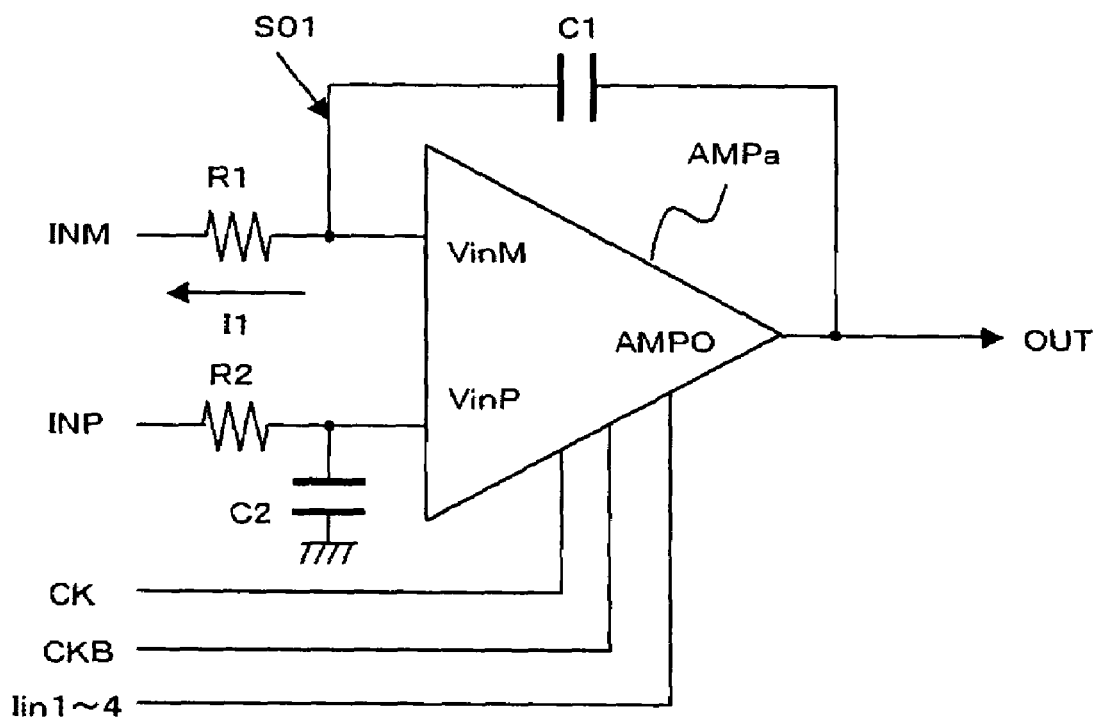
FIG. 1 is a circuit diagram of an integrating circuit according to an embodiment of the present invention.
Figure 6:
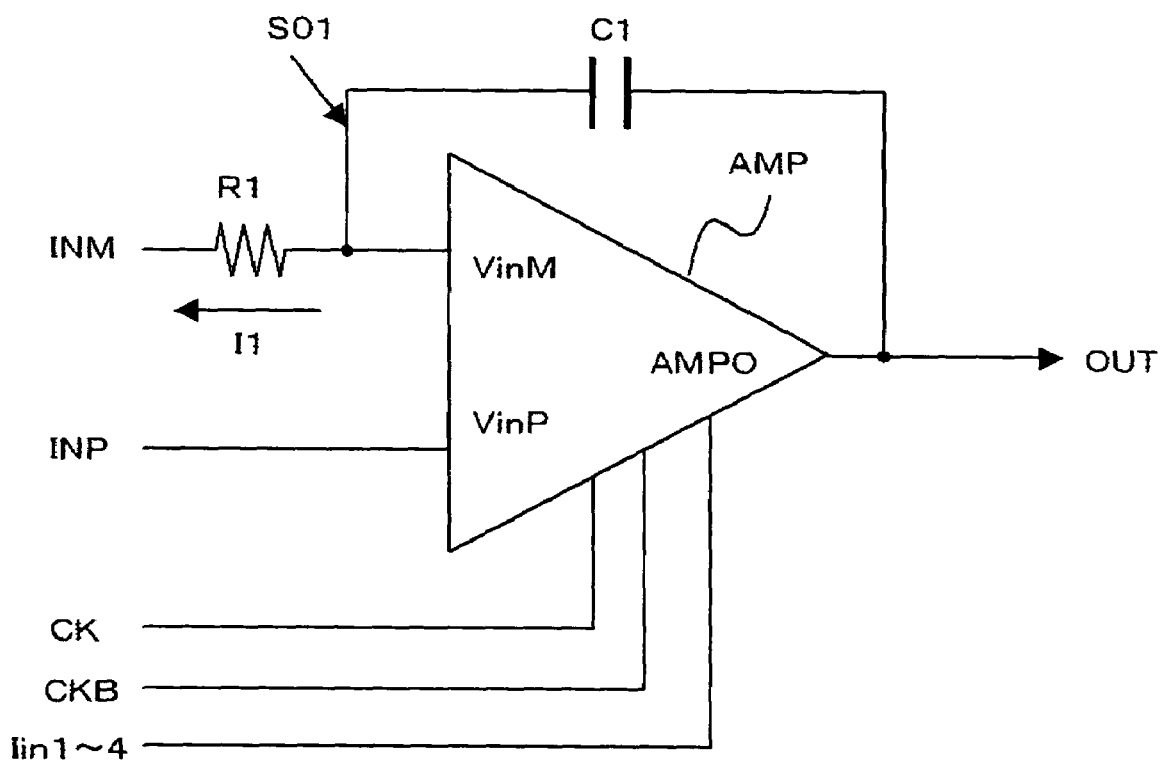
FIG. 6 is a circuit diagram of an integrating circuit according to the prior art.

FIG. 1 is a circuit diagram of an integrating circuit according to this embodiment of the present invention. As shown in FIG. 1, the integrating circuit has a differential amplifier circuit AMPa, resistors R1, R2 and capacitors C1, C2. The form of the connection of the differential amplifier circuit AMPa, resistor R1 and capacitor C1 is the same as that shown in FIG. 6. In order to balance with the resistor R1 and capacitor C1, a dummy resistor R2 and a dummy capacitor C2 whose values are equal to those of the resistor R1 and capacitor C1 are connected between the input terminal INP and non-inverting input terminal VinP and between the non-inverting input terminal VinP and ground GND, respectively.

Figure 2:
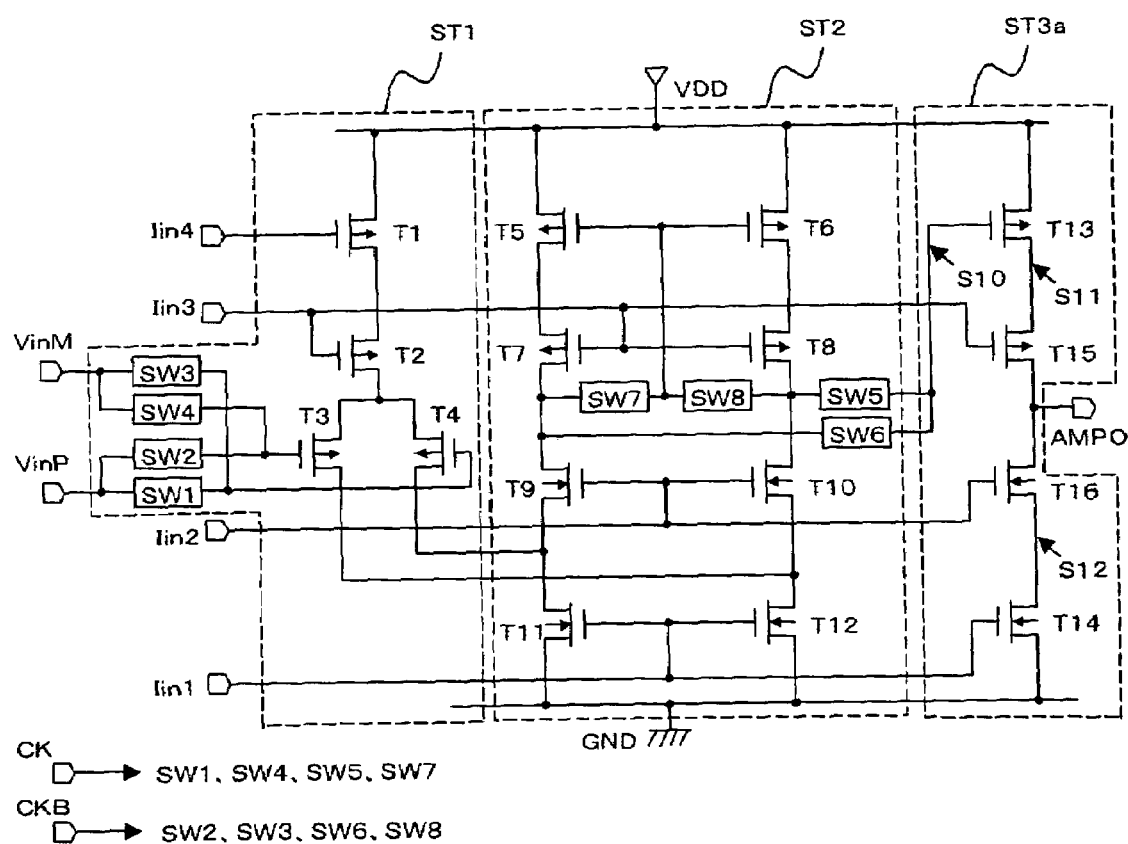
FIG. 2 is a circuit diagram of a differential amplifier circuit according to the embodiment.
Figure 7:
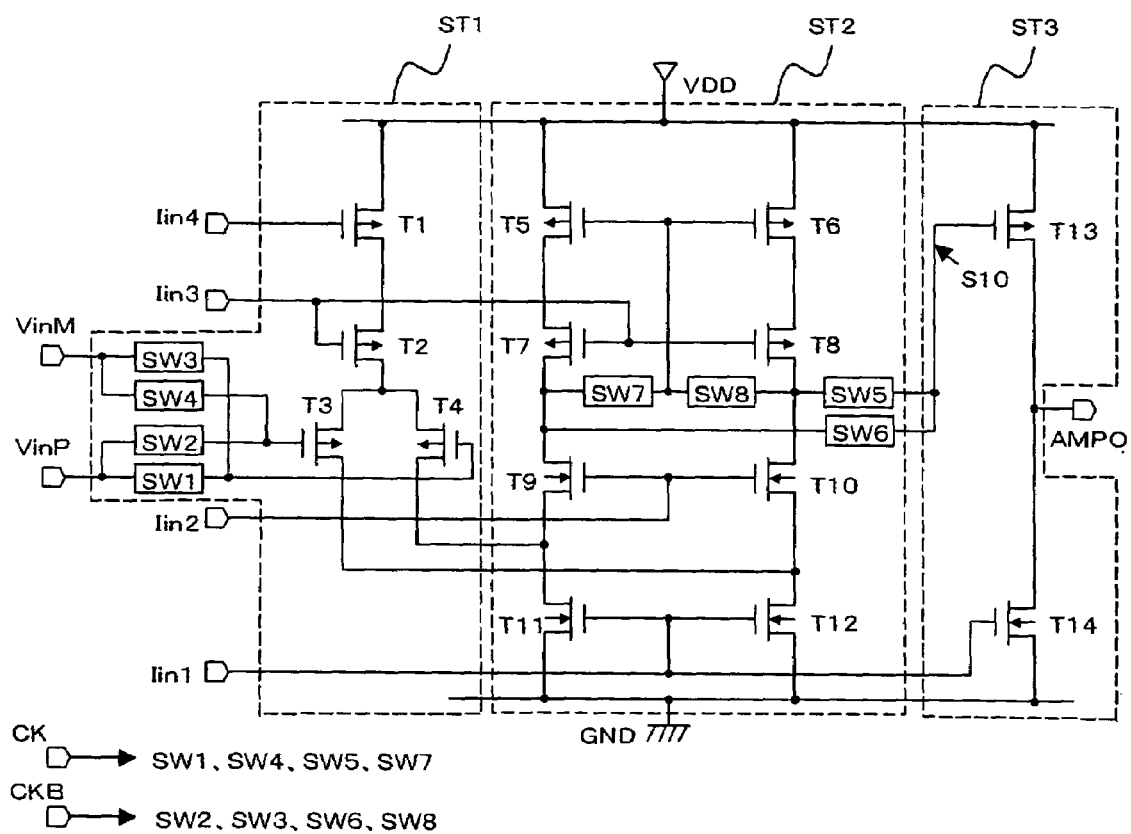
FIG. 7 is a reference circuit diagram of a differential amplifier circuit which has been formulated by the inventor in the trial course toward the present invention.
Figure 8:
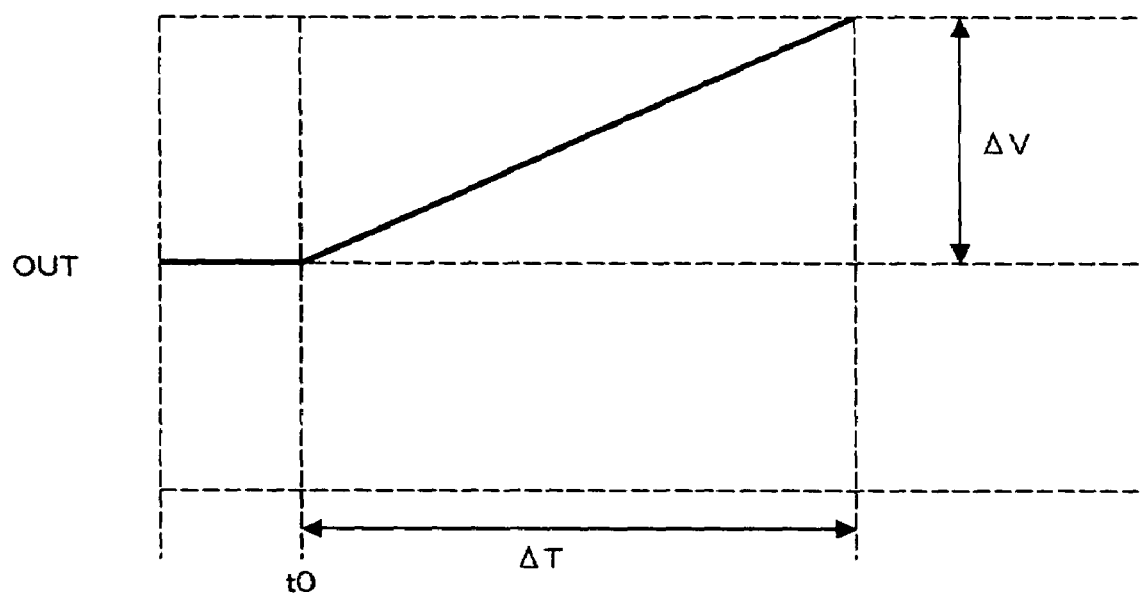
FIG. 8 is a diagram illustrating the operating waveform of an integrating circuit.

FIG. 2 is a circuit diagram of a differential amplifier circuit according to this embodiment. Components identical with those shown in FIG. 7 are designated by like reference characters and need not be described again. The differential amplifier circuit of FIG. 2 differs in that an output stage ST3a has a cascode connection in comparison with the output stage ST3 of FIG. 7. That is, a P-channel transistor T15 is added on between the P-channel transistor T13 and output terminal AMPO, and an N-channel transistor T16 is added on between the N-channel transistor T14 and output terminal AMPO. The P-channel transistor T15 has its source connected to the drain of the P-channel transistor T13, its gate connected to the terminal Iin3 and its drain connected to the output terminal AMPO. The N-channel transistor T16 has its source connected to the drain of the N-channel transistor T14, its gate connected to the terminal Iin2 and its drain connected to the output terminal AMPO.

Figure 9:
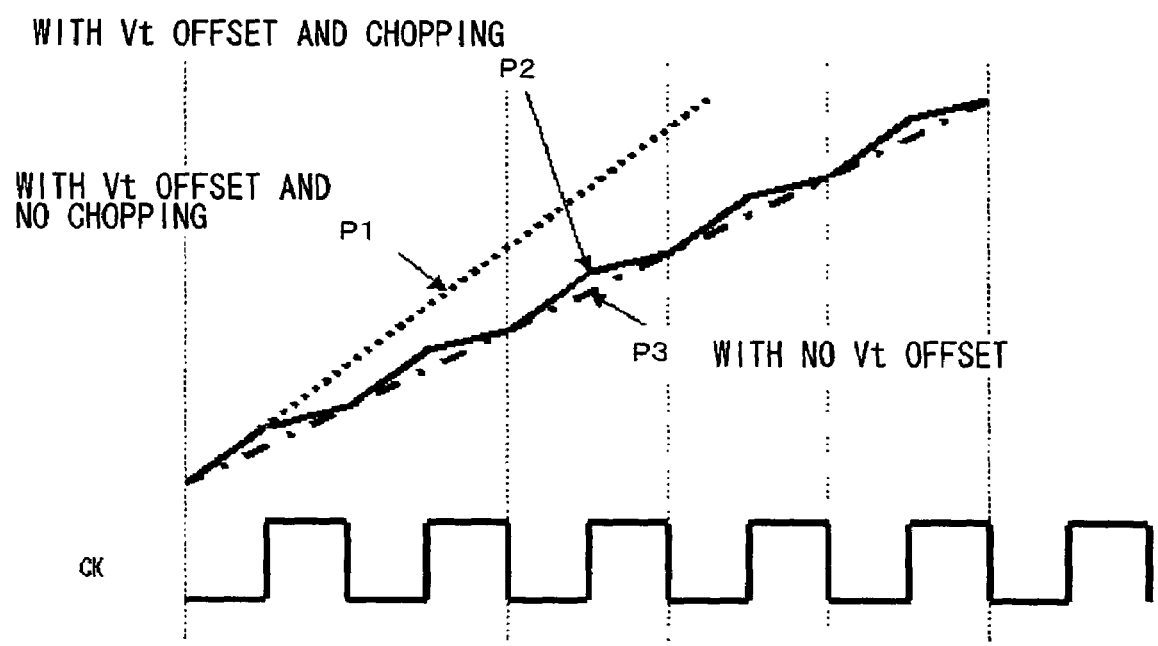
FIG. 9 is a diagram illustrating the operating waveform of an integrating circuit.
Figure 10:
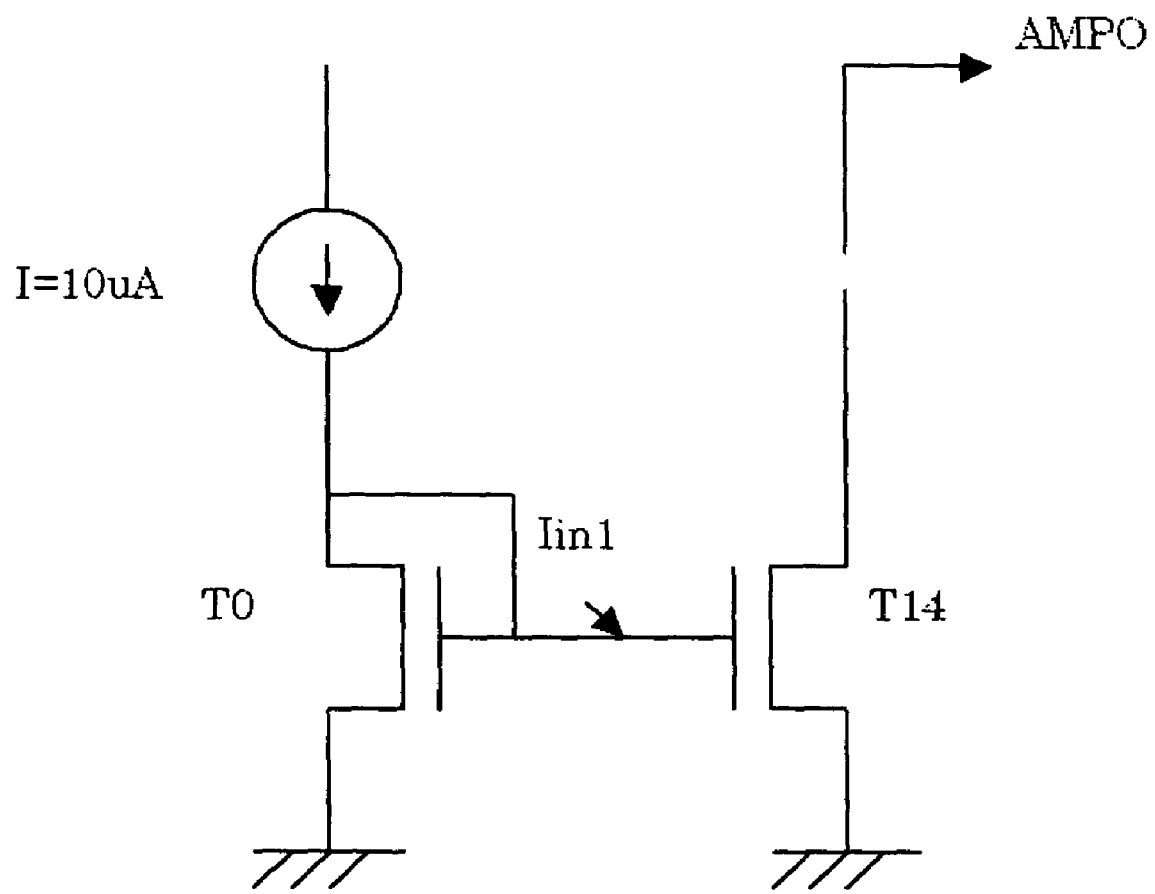
FIG. 10 is a diagram illustrating the gate connection of an N-channel transistor T14.
Figure 11:
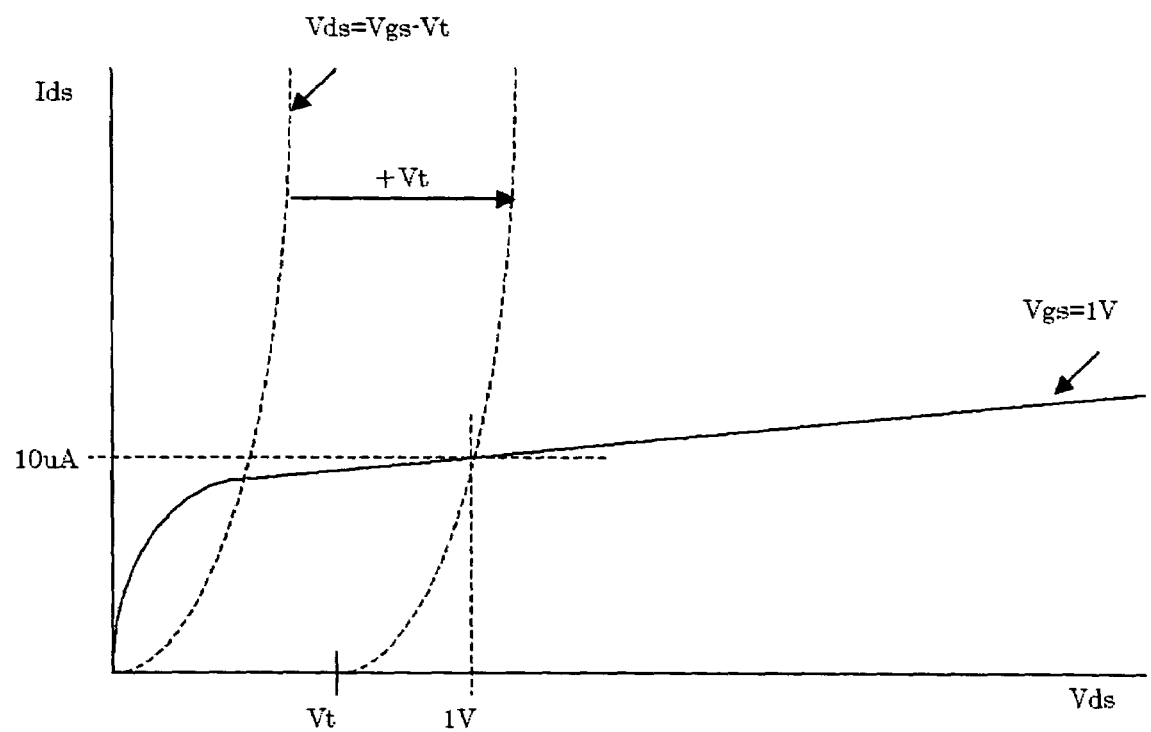
FIG. 11 is a first diagram illustrating a Vds vs. Ids characteristic of an N-channel transistor.
Figure 12:
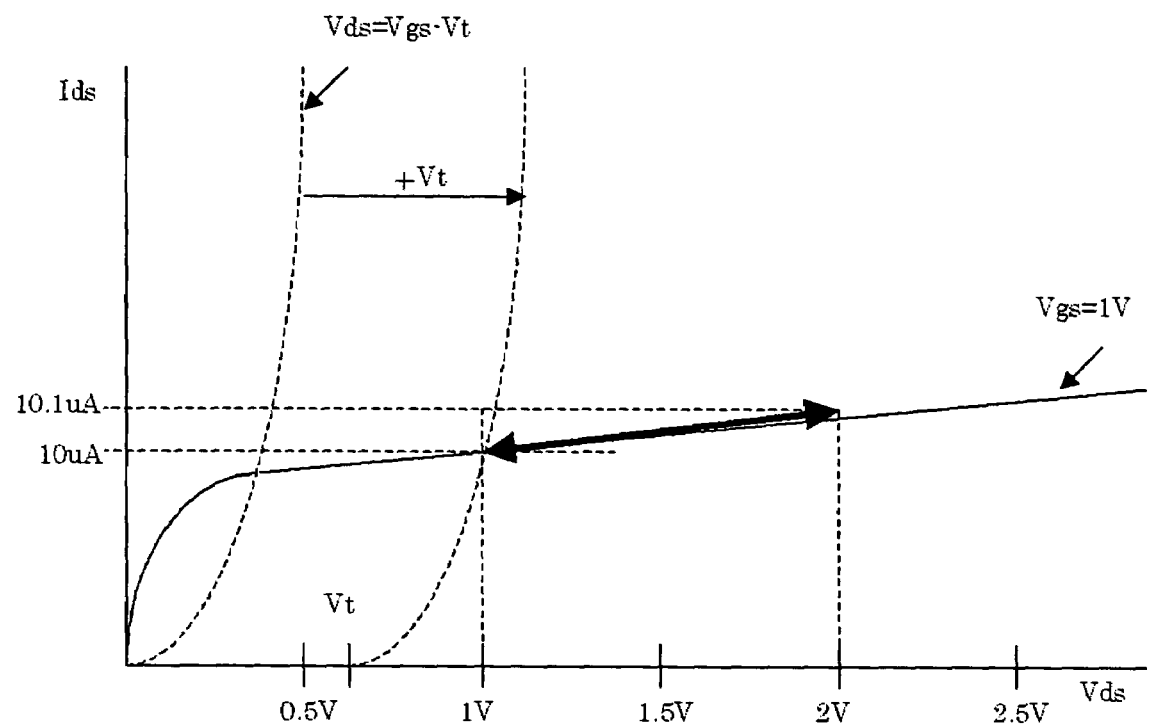
FIG. 12 is a first diagram illustrating a Vds vs. Ids characteristic of an N-channel transistor.
Figure 13:
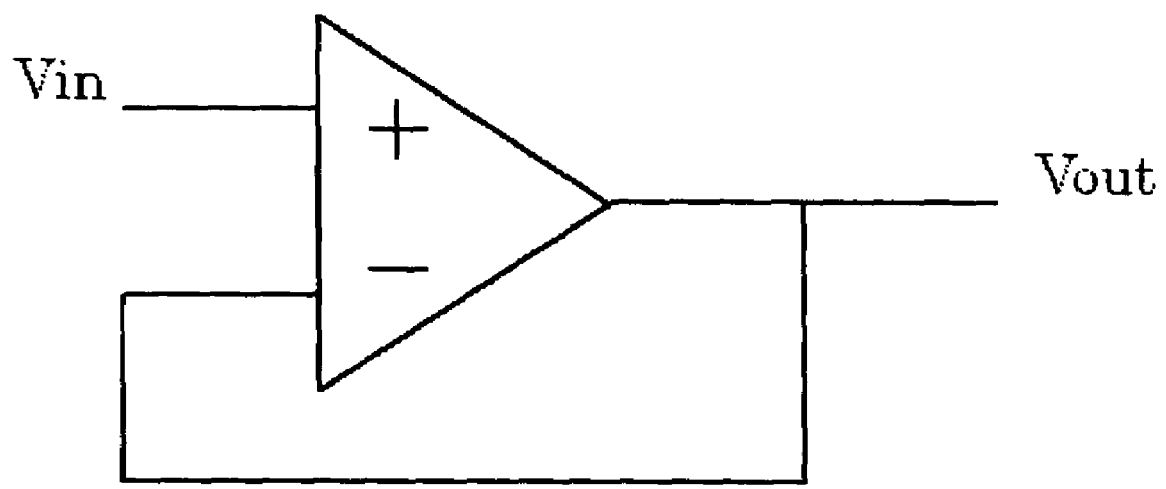
FIG. 13 is a circuit diagram illustrating a voltage follower.

Thus, the P-channel transistor T15 is cascode-connected to the drain of the P-channel transistor T13, and the N-channel transistor T16 is cascode-connected to the drain of the N-channel transistor T14, whereby a so-called cascode-connected arrangement (cascode arrangement) is formulated. In accordance with this cascode arrangement, the drain potentials of the P-channel transistor T13 and N-channel transistor T14 are held substantially constant by the P-channel transistor T15 and N-channel transistor T16, respectively, even if the potential at the output terminal AMPO varies. Accordingly, a fluctuation in the currents that flow into the P-channel transistor T13 and N-channel transistor T14 becomes very small. In other words, there is almost no change in the transconductance of the P-channel transistor T13 and N-channel transistor T14 until the potential of the output terminal AMPO becomes very close to the potential of the power supply VDD or the potential at ground GND. Consequently, a low input offset voltage that is not dependent upon the value of the output voltage can be maintained over a broad output-voltage range and, as illustrated in FIG. 9B, the linearity of the output waveform of the integrating circuit can be maintained.

Figure 3A:
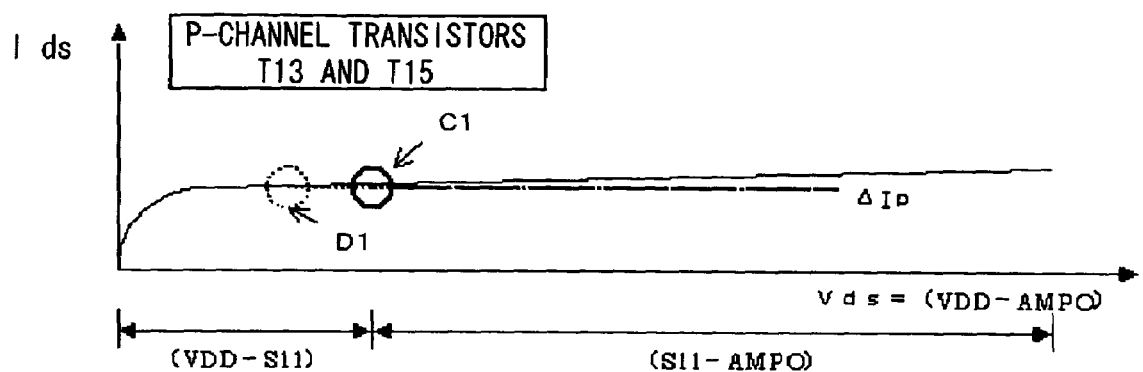
FIGS. 3A and 3B are diagrams illustrating transistor characteristics of an output circuit in this embodiment.
Figure 3B:
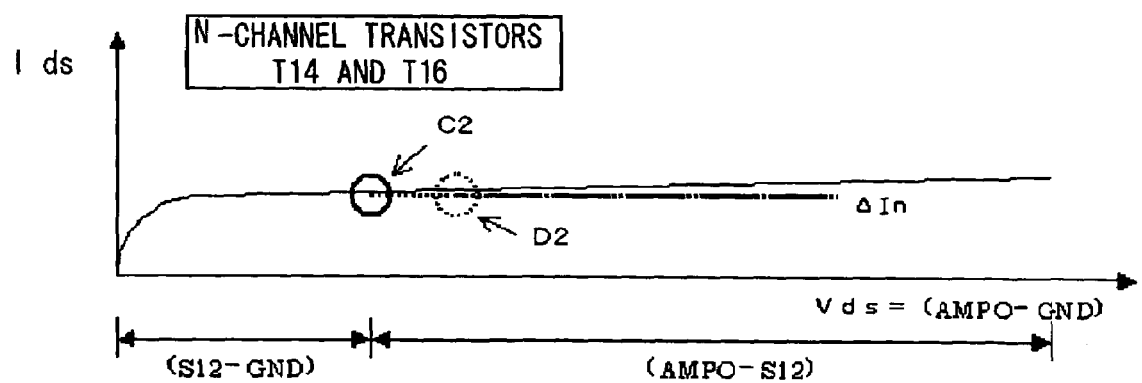

This condition will be described in regard to the Vds vs. Ids characteristic. FIGS. 3A and 3B illustrate the Vds vs. Ids characteristic in the cascade connection of the P-channel transistors T13 and T15 and in the cascade connection of the N-channel transistors T14 and T16, respectively, in the differential amplifier circuit of the present invention. For example, in an instance where the potential at the output terminal AMPO is in the vicinity of half of the power-supply voltage, assume that the position is position C1 in FIG. 3A in case of the P-channel transistor T13 and position C2 in FIG. 3B in case of N-channel transistor T14. This time the P-channel transistor T13 and the N-channel transistor T14 are held in balance. Next, if the integrating circuit performs a charging operation and the potential at the output terminal AMPO is in the vicinity of the power-supply voltage VDD, then the drain-source voltages Vds of the P-channel transistor T13 and N-channel transistor T14 will be at position D1 in FIG. 3A and position D2 in FIG. 3B, respectively. This indicates that owing to the P-channel transistor T15 and N-channel transistor T16 arranged in cascode, the drain-source voltage Vds (=potential of the power supply VDD−potential at node S11) of the P-channel transistor T13 and the drain-source voltage Vds (=potential at node S12−potential at ground GND) of the N-channel transistor T14 are held substantially constant irrespective of the potential at the output terminal AMPO. Under ideal conditions, the drain current Ids of P-channel transistor T13 at position C1 and position D1 and the drain current Ids of the N-channel transistor T14 at position C2 and position D2 will not change.

Figure 14:
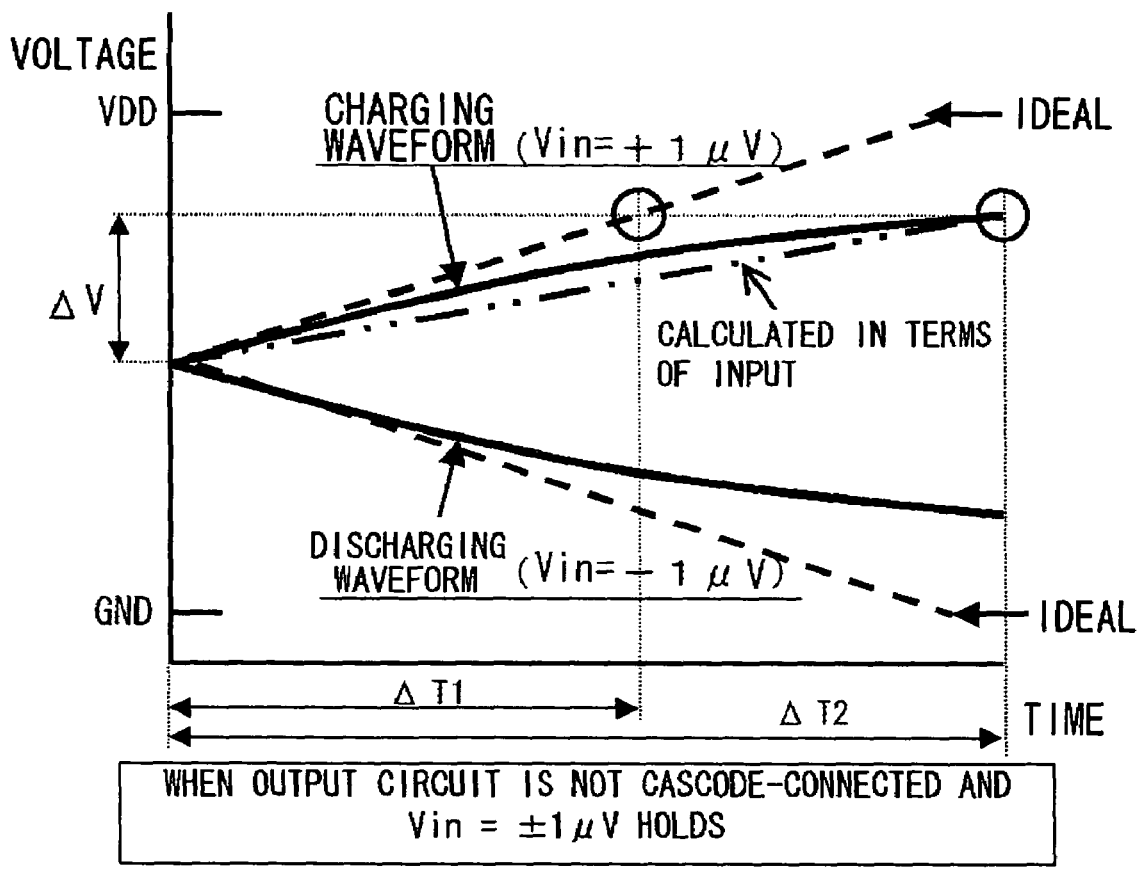
FIG. 14 is a diagram illustrating a charge/discharge waveform of an integrating circuit.

Thus, the P/N ratio at positions D1, D2 undergoes almost no change compared with the P/N ratio at positions C1, C2. As for the output of the integrating circuit, therefore, a constant current is output even if the potential of the output OUT is close to the potential of the power supply VDD, and hence the slope is fixed as indicated by the (ideal) charging waveform of the dashed line in FIG. 14. At the time of discharge, the current ratio of the P-channel transistor T13 and N-channel transistor T14 becomes the inverse of that at the time of the charging operation. At this also the slope is fixed and linearity is maintained even if the potential at the output OUT is in the vicinity of the potential at ground GND.

Next, the N-channel transistors T14 and T16 will be described in greater detail. Constant voltages equal to or greater than the threshold-value voltage Vt of the N-channel transistor T14 and of N-channel transistor T16 are applied to the bias terminals Iin1 and Iin2. When a voltage is output at the output terminal AMPO, therefore, the N-channel transistors T14 and T16 turn on and a current starts to flow between the drain and source of the N-channel transistors T14 and T16. This current is decided by the drain-source voltage and gate-source voltage of the N-channel transistors T14 and T16. In actuality, the N-channel transistors T14 and T16 are cascode-connected and the voltage values applied to the gates are constant. The current value, therefore, varies with a change in the voltage value at node S12. The value of the voltage at node S12 is balanced at the point where the value of the current that flows from the output terminal AMPO to ground GND through the N-channel transistors T14 and T16 is maximized.

Furthermore, consider a case where the voltage at output terminal AMPO varies. If the output voltage at the output terminal AMPO rises, the drain-source voltage of the N-channel transistor T16 increases, as a result of which the value of the current that can flow between the drain and source of the N-channel transistor T16 increases. The N-channel transistors T14 and T16, however, are cascode-connected. This means that unless the value of the current that can flow between the drain and source of the N-channel transistor T14 also increases and not just the value of the current that flows between the drain and source of the N-channel transistor T16, the value of the current that flows from the output terminal AMPO to ground GND via the N-channel transistors T16 and T14 cannot be increased. Here the voltage value at the node S12 rises in order to increase the drain-source voltage of the N-channel transistor T14. However, with regard to the gate-source voltage of the N-channel transistor T16, it will be understood that the gate-source voltage of the N-channel transistor T16 is in a decreasing relationship. In other words, if the voltage value at the node S12 rises, the drain-source voltage increases in regard to the N-channel transistor T14 and therefore the value of the current that flows between the drain and source increases. In regard to the N-channel transistor T16, however, the gate-source voltage decreases and therefore the value of the current that flows into between the drain and the source decreases.

Figure 4:
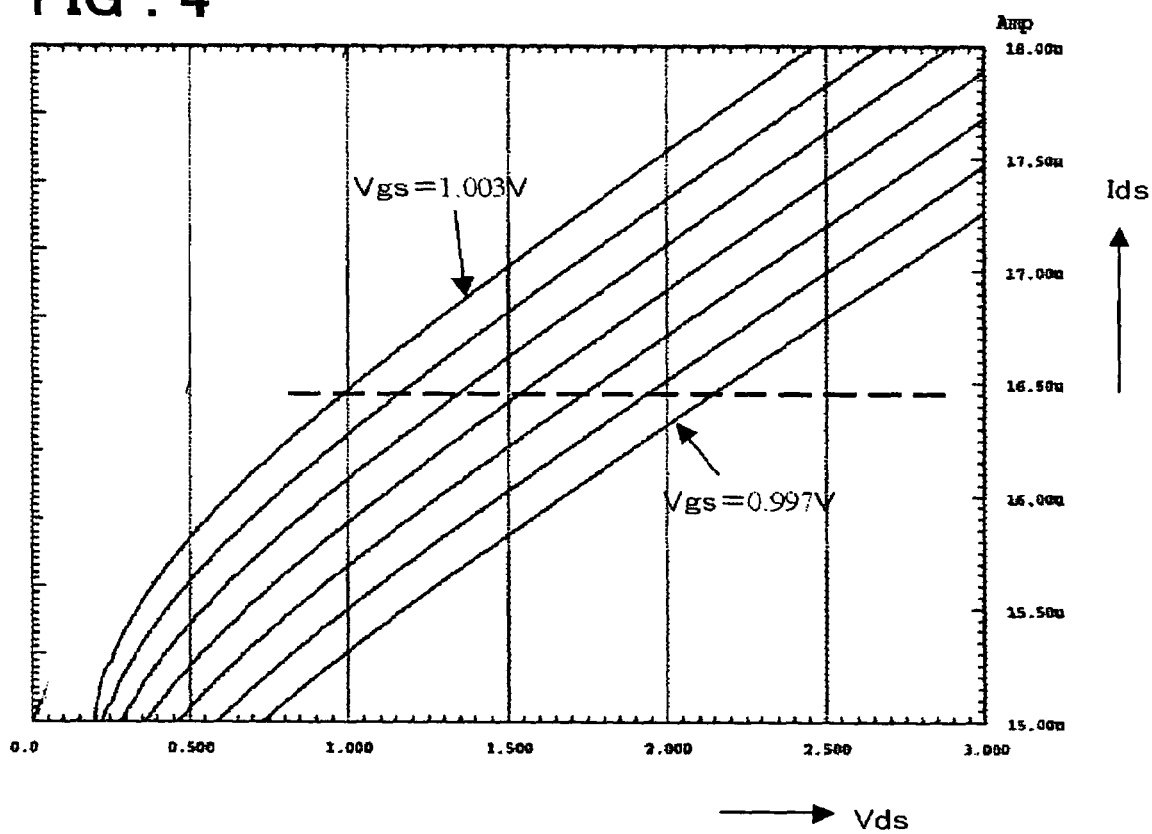
FIG. 4 is a diagram illustrating a drain-source voltage vs. drain-source current characteristic of an N-channel transistor T14.

The relationship of the current that flows between the source and the drain to the change in the drain-source voltage value of a transistor and the relationship of the current that flows between the drain and source to a change in the gate-source voltage value will be considered. FIG. 4 illustrates the result of obtaining, by simulation, a drain-source voltage (Vds) vs. drain-source current (Ids) characteristic at gate-source voltages (Vgs) of the N-channel transistor T14 ranging from 0.997 to 1.003V (in steps of 1 mV). By way of example, consider a change in Vgs with respect to Vds for passing a certain value of current Ids. In order to pass the current Ids when Vgs=1V and Vds=1.5V holds, it will suffice if Vgs=0.998V holds in case of Vds=2.0V and Vds=1.003V holds in case of Vds=1.0V. Thus, Vgs will not change much even if Vds changes a great deal. That is, if the amount of change in the gate-source voltage is compared with the amount of change in the drain-source voltage, it will be understood that the value of the current that flows between the drain and source will be influenced greatly by the amount of change in the gate-source voltage value.

In the case of the present invention, on the other hand, when it is attempted to increase the value of current that flows from the output terminal AMPO to ground GND through the N-channel transistors T16 and T14 by increasing the drain-source voltage of the N-channel transistor T14, the voltage value at node S12 rises and therefore the value of the gate-source voltage of N-channel transistor T16 decreases. When the gate-source voltage of N-channel transistor T16 decreases even slightly, the value of the current that flows between the drain and source of N-channel transistor T16 decreases sharply, as mentioned above. As a result, there is a sharp decrease in the value of the current that flows from the output terminal AMPO to ground GND through the N-channel transistors T16 and T14. Accordingly, even if the value of the output voltage at the output terminal AMPO rises, the voltage value at node S12 undergoes almost no change and it is possible to hold substantially constant the drain-source voltage of N-channel transistor T14.

Figure 5:
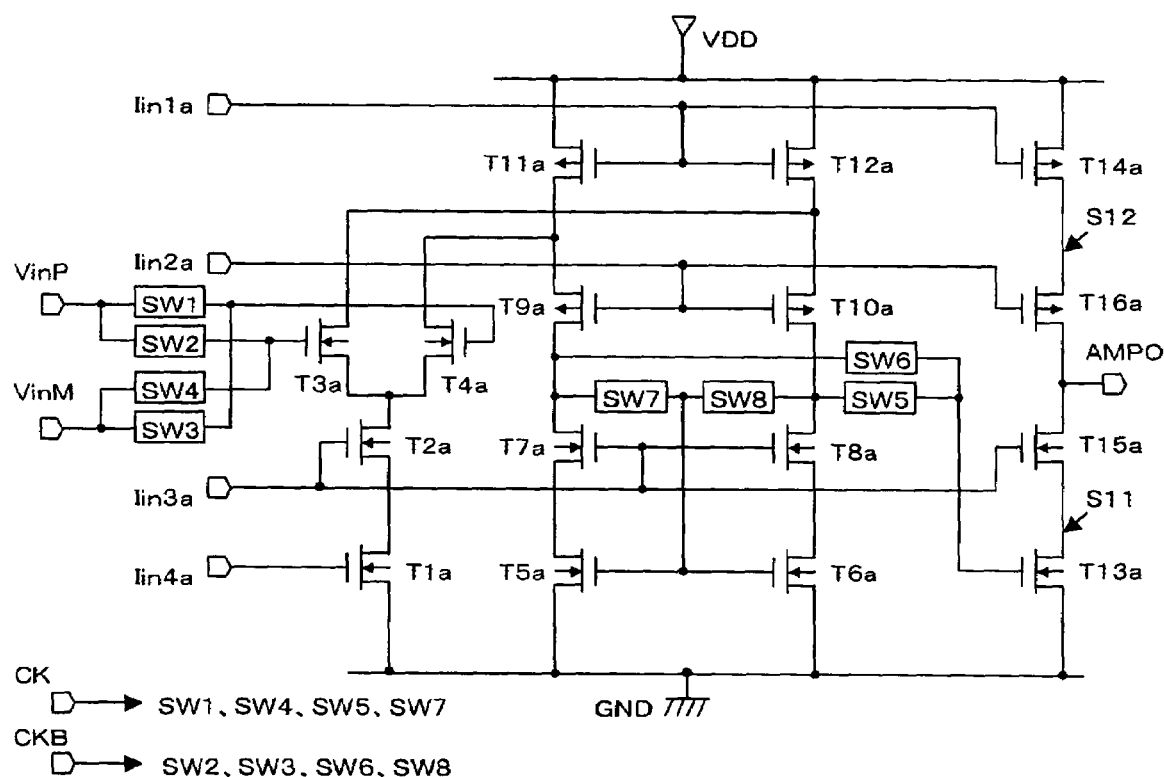
FIG. 5 is a circuit diagram of another differential amplifier circuit according to the embodiment.

It goes without saying that in the differential amplifier circuit of FIG. 2 described above, P-channel transistors may be replaced by N-channel transistors, N-channel transistors may be replaced by P-channel transistors and the power supply VDD and ground GND may be interchanged, thereby constructing a differential amplifier circuit of the kind shown in FIG. 5. Even if a differential amplifier circuit of the kind shown in FIG. 5 is used instead of the differential amplifier circuit of FIG. 2, a highly accurate differential amplifier circuit can be realized in similar fashion.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier circuit comprising:
   an input-stage differential amplifier section connected between a first power supply and a second power supply; and
   an output section connected to the input-stage differential amplifier section;
   wherein said output section has a cascode-connected formulation and is connected between said first and second power supplies,
   wherein said output section comprises:
      a first MOS transistor of a first conductivity type having a gate to which a non-inverted output of said input-stage differential amplifier section is connected and a first end to which said first power supply is connected;
      a second MOS transistor of the first conductivity type having a gate to which a first bias terminal is connected and a first end to which a second end of said first MOS transistor of the first conductivity type is connected;
      a first MOS transistor of a second conductivity type having a gate to which a second bias terminal is connected and a second end to which the second end of said second MOS transistor of the first conductivity type is connected; and
      a second MOS transistor of the second conductivity type having a gate to which a third bias terminal is connected, a second end to which a first end of said first MOS transistor of the second conductivity type is connected, and a first end to which a said second power supply is connected;
   the second end of said second MOS transistor of the first conductivity type being connected to an output terminal.

2. The circuit according to claim 1, wherein said output section has a single-ended formulation.

3. The circuit according to claim 1, wherein said input-stage differential amplifier section has a folded-cascode-connected formulation.

4. The circuit according to claim 1, further comprising:
a first switch that opens and closes a path between a non-inverting input terminal and a non-inverting input of said input-stage differential amplifier section;
a second switch That opens and closes a path between the non-inverting input terminal and an inverting input of said input-stage differential amplifier circuit;
a third switch that opens and closes a path between an inverting input terminal and the non-inverting input of said input-stage differential amplifier circuit;
a fourth switch that opens and closes path between the inverting input terminal and the inverting input of said input-stage differential amplifier circuit;
a fifth switch that opens and closes a path between a non-inverted output of said input-stage differential amplifier circuit and the gate of said first MOS transistor of the first conductivity type; and
a sixth switch that opens and closes a path between an inverted output of said input-stage differential amplifier circuit and the gate of said first MOS transistor of the first conductivity type;
wherein said first, fourth and fifth switches are operated in reverse with respect to said second, third and sixth switches by a chopping clock signal.

5. An integrating circuit, comprising:
the differential amplifier circuit described in claim 1;
a first resistance element connected between a first input terminal and an inverting input terminal of said differential amplifier circuit;
a first capacitance element connected between the inverting input terminal and the output terminal of said differential amplifier circuit;
a second resistance element connected between a second input terminal and the non-inverting input terminal of said differential amplifier circuit; and
a second capacitance element connected between the non-inverting input terminal and ground;
wherein said first and second resistance elements have substantially equal resistance values and said first and second capacitance elements have substantially equal capacitance values.

6. A semiconductor device having the differential amplifier circuit described in claim 1.

7. The differential amplifier circuit of claim 1, further comprising:
a plurality of input switching transistors; and
a plurality of output switching transistors,
wherein said input switching transistors and said output switching transistors are interconnected to concurrently reverse polarities of input signals and output signals in a manner that reduces an offset voltage effect of said differential amplifier circuit.

8. The differential amplifier circuit of claim 1, wherein:
said output stage comprises first and second transistors connected serially between the output terminal and said first power-supply;
said first transistor is provide in order to suppress a fluctuation in voltage at a connection node of said first and second transistors;
said first transistor comprises a gate to which is input a voltage equal to or greater than a threshold value of said first transistor; and
said second transistor comprises a gate to which is input a voltage at which said second transistor operates in a saturated region.

9. A semiconductor device comprising an output stage that receives an input signal, generates an output signal and delivers the output signal to an output terminal, wherein:
said output stage comprises first and second transistors connected serially between the output terminal and a first power-supply line;
said first transistor is provided in order to suppress a fluctuation in voltage at a connection node of said first and second transistors;
said first transistor comprises a gate to which is input a voltage equal to or greater than a threshold value of said first transistor; and
said second transistor comprises a gate to which is input a voltage at which said second transistor operates in a saturated region.

10. The device according to claim 9, wherein said output stage further comprises third and fourth transistors connected serially between the output terminal and a second power-supply line; and
said third transistor is provided in order to suppress a fluctuation in voltage at a connection node of said third and fourth transistors.

11. The device according to claim 10, wherein said third transistor comprises a gate to which is input a voltage equal to or greater than a threshold value of said third transistor; and
said fourth transistor comprises a gate to which is input a voltage at which said fourth transistor operates in the saturated region.

12. The device according to claim 9, wherein the input signal is input to the gate of said second transistor.

13. The device according to claim 10, wherein said first and second transistors comprise transistors of a first conductivity type, and said third and fourth transistors comprise transistors of a second conductivity type that is different from the first conductivity type.

14. The device according to claim 10, wherein said first and third transistors are connected to the output terminal, said second transistor is connected to the first power-supply line, and said fourth transistor is connected to the second power-supply line.

15. A differential amplifier circuit, comprising:
an input-stage differential amplifier section including a plurality of input switching transistors; and
an output section connected to the input-stage differential amplifier section and including a plurality of output switching transistors, said output section comprising a cascade-connected configuration,
wherein said input switching transistors and said output switching transistors are interconnected to concurrently reverse polarities of input signals and output signals in a manner that reduces an offset voltage effect of said differential amplifier circuit.

16. The circuit according to claim 15, wherein said output section comprises a single-ended configuration.

17. The circuit according to claim 15, wherein said input-stage differential amplifier section comprises a folded-cascode-connected configuration.

18. The circuit according to claim 15, wherein said output section comprises first and second transistors connected serially between an output terminal of said output section and a first power-supply line;
said first transistor is provided in order to suppress a fluctuation in voltage at a connection node of said first and second transistors;
said first transistor comprises a gate to which is input a voltage equal to or greater than a threshold value of said first transistor; and said second transistor comprises a gate to which is input a voltage at which said second transistor operates in the a saturated region.

19. The circuit according to claim 15, further comprising:
a first resistance element connected between a first input terminal and an inverting input terminal of said differential amplifier circuit;
a first capacitance element connected between the inverting input terminal and an output terminal of said differential amplifier circuit;
a second resistance element connected between a second input terminal and the non-inverting input terminal of said differential amplifier circuit; and
a second capacitance element connected between the non-inverting input terminal and a ground,
wherein said first and second resistance elements have substantially equal resistance values and said first and second capacitance elements have substantially equal capacitance values.

* * * * *